(12) United States Patent
Arai

(10) Patent No.: US 7,704,769 B2
(45) Date of Patent: Apr. 27, 2010

(54) OPTICAL DEVICE MANUFACTURING METHOD

(75) Inventor: Kazuhisa Arai, Ota-Ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 12/396,995

(22) Filed: Mar. 3, 2009

(65) Prior Publication Data
US 2009/0233419 A1 Sep. 17, 2009

(30) Foreign Application Priority Data
Mar. 14, 2008 (JP) ............................. 2008-065626

(51) Int. Cl.
*H01L 21/00* (2006.01)
(52) U.S. Cl. ................... 438/33; 257/E21.237
(58) Field of Classification Search ............... 438/33; 257/E21.237
See application file for complete search history.

(56) References Cited

U.S. PATENT DOCUMENTS

2008/0233712 A1* 9/2008 Sekiya ..................... 438/462
2008/0268619 A1* 10/2008 Nakamura ................. 438/463
2009/0098711 A1* 4/2009 Sekiya ...................... 438/460
2009/0124063 A1* 5/2009 Nakamura ................. 438/463
2009/0197395 A1* 8/2009 Nakamura et al. ........ 438/463
2009/0215245 A1* 8/2009 Nakamura ................. 438/463

FOREIGN PATENT DOCUMENTS

JP    A 60-92686    5/1985
JP    A 10-305420   11/1998

* cited by examiner

*Primary Examiner*—Thao P. Le
(74) *Attorney, Agent, or Firm*—Greer, Burns & Crain, Ltd.

(57) ABSTRACT

An optical device manufacturing method including the steps of: forming a groove with a depth corresponding to a finish thickness of the heat sink in a heat sink material at a position corresponding to an associated one of the streets sectioning the plurality of optical devices; joining the optical device layer of the optical device wafer to the heat sink material via a joining metal layer; cutting and dividing the optical device wafer along the streets into individual optical devices; sticking a protection member to the rear surface of the substrate of the optical device wafer; and grinding the rear surface of the heat sink material to expose the grooves to the rear surface to thereby divide the heat sink material into heat sinks corresponding to associated individual optical devices.

2 Claims, 12 Drawing Sheets

OPTICAL DEVICE MANUFACTURING METHOD

BACKGROUND OF THE INVENTION

1. Field of the Invention

The present invention relates to an optical device manufacturing method of dividing an optical device wafer into a plurality of optical devices sectioned along streets and joining a heat sink to each of the optical devices, the optical device wafer being formed with the optical devices in an optical device layer lying on the front surface of a substrate.

2. Description of the Related Art

In the optical device manufacturing step, a plurality of optical devices are formed in an optical device layer made of a gallium nitride-based compound semiconductor or the like on the front surface of a sapphire substrate, a silicon carbide substrate or the like. An optical device wafer formed with the optical devices in the optical device layer as mentioned above is divided into the individual optical devices sectioned along streets for manufacture.

As a method of dividing an optical device wafer along streets, a method is proposed in which a laser beam capable of passing through an optical device wafer is directed along a street to form a laser-processed groove and external force is applied along the laser-processed groove to split the wafer. See e.g. Japanese Patent Laid-open No. Hei 10-305420. On the other hand, since an optical device produces heat, a heat sink member is joined to the optical device in order to dissipate the heat. See e.g. Japanese Patent Laid-open No. Sho 60-92686.

An optical device is formed e.g. 0.3×0.3 mm square. It is troublesome to join each heat sink to such a small optical device, which poses a problem of poor productivity. It may be intended that a heat sink material having a size corresponding to that of an optical device wafer is joined to the front surface of an optical device layer and a laser beam is directed along a street formed on the optical device wafer to cut the heat sink material along with an optical device wafer. However, since the heat resulting from the energy of the laser beam escapes through the heat sink material made of metal such as copper, the heat sink material cannot be cut.

Alternatively, it may be intended that a heat sink material having a size corresponding to an optical device wafer is joined to the front surface of an optical device layer and the heat sink material together with the optical device wafer is cut along streets formed on the optical device wafer by a cutting blade. Even such a case, it is difficult to simultaneously cut the high-brittle optical device wafer and the heat sink material made of metal such as high-ductile copper.

SUMMARY OF THE INVENTION

Accordingly, it is an object of the present invention is to provide an optical device manufacturing method capable of dividing an optical device wafer into a plurality of optical devices sectioned along streets and effectively joining a heat sink to each of the optical devices, the optical device wafer being formed with the optical devices in an optical device layer lying on the front surface of a substrate.

In accordance with a first aspect of the present invention, there is provided an optical device manufacturing method of dividing an optical device wafer into a plurality of optical devices sectioned along streets, the optical device wafer being formed with the optical devices in an optical device layer laminated on a front surface of a substrate, the method including: a heat sink material groove forming step of forming a groove with a depth corresponding to a finish thickness of the heat sink in a front surface of a heat sink material having a size corresponding to that of the optical device wafer at a position corresponding to an associated one of the streets sectioning the plurality of optical devices; a heat sink material joining step of joining the front surface of the optical device layer of the optical device wafer to the front surface of the heat sink material via a joining metal layer with the street oppositely faced to the groove; an optical device wafer dividing step of cutting and dividing the optical device wafer along the streets into individual optical devices, the optical device wafer having the optical device layer to which the heat sink material is joined; a protection member sticking step of sticking a protection member to a rear surface of the substrate of the optical device wafer having been subjected to the optical device wafer dividing step; and a heat sink material dividing step of grinding the rear surface of the heat sink material joined to the optical device layer of the optical device wafer to which the protection member is stuck to expose the grooves to the rear surface to thereby dividing the heat sink material into heat sinks corresponding to associated individual optical devices.

In accordance with a second aspect of the present invention, there is provided an optical device manufacturing method of dividing an optical device wafer into a plurality of optical devices sectioned along streets, the optical device wafer being formed with the optical devices in an optical device layer laminated on a front surface of a substrate, the method including: a heat sink material groove forming step of forming a groove with a depth corresponding to a finish thickness of the heat sink in a front surface of a heat sink material having a size corresponding to that of the optical device wafer at a position corresponding to an associated one of the streets sectioning the plurality of optical devices; a heat sink material joining step of joining the front surface of the optical device layer of the optical device wafer to the front surface of the heat sink material via a joining metal layer with the street oppositely faced to the groove; a substrate peeling-off step of peeling off from the optical device layer the substrate of the optical device wafer having the optical device layer to which the heat sink material is joined; an optical device layer dividing step of cutting and dividing the optical device layer from which the substrate of the optical device wafer has been peeled off, along the streets into individual optical devices; a protection member sticking step of sticking a protection member to a rear surface of the optical device layer having been subjected to the optical device layer dividing step; and a heat sink material dividing step of grinding rear surface of the heat sink material joined to the optical device layer to which the protection member is stuck to expose the grooves to the rear surface to divide the heat sink material into heat sinks corresponding to the associated individual optical devices.

According to the first aspect of the present invention, the groove with a depth corresponding to the finish thickness of the heat sink is formed in the front surface of the heat sink material having a size corresponding to that of the optical device wafer at a position corresponding to an associated one of the streets sectioning the plurality of optical devices, and then, the heat sink material joining step is performed of joining the front surface of the optical device layer of the optical device wafer formed in the optical device layer to the front surface of the heat sink material via a joining metal layer with the street oppositely faced to the groove. Thereafter, the optical device wafer is cut and divided along the streets into individual optical devices and then the rear surface of the heat sink material is ground to expose the grooves to the rear surface to divide the heat sink material into the heat sinks corresponding to the associated individual optical devices. Thus, the optical devices to which the heat sinks are joined can efficiently be manufactured.

According to the second aspect of the present invention, after the heat sink groove forming step and heat sink joining step described above have been performed, the substrate peeling-off step is performed of peeling off from the optical device layer the substrate of the optical device wafer to which the heat sink material is joined. Then, the optical device layer dividing step is performed of cutting and dividing along the streets the optical device layer from which the substrate of the optical device wafer has been peeled off, into the individual optical devices. Thereafter, the protection member sticking step and heat sink material dividing step are preformed. Thus, the individual optical devices can be obtained from which the substrate has been peeled off and to which the heat sinks are joined. In this way, in the optical device wafer, the substrate which functionally becomes unnecessary after the optical device layer has been formed on the front surface of the substrate is peeled off and removed; therefore, the devices can each be made compact and functional by itself.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
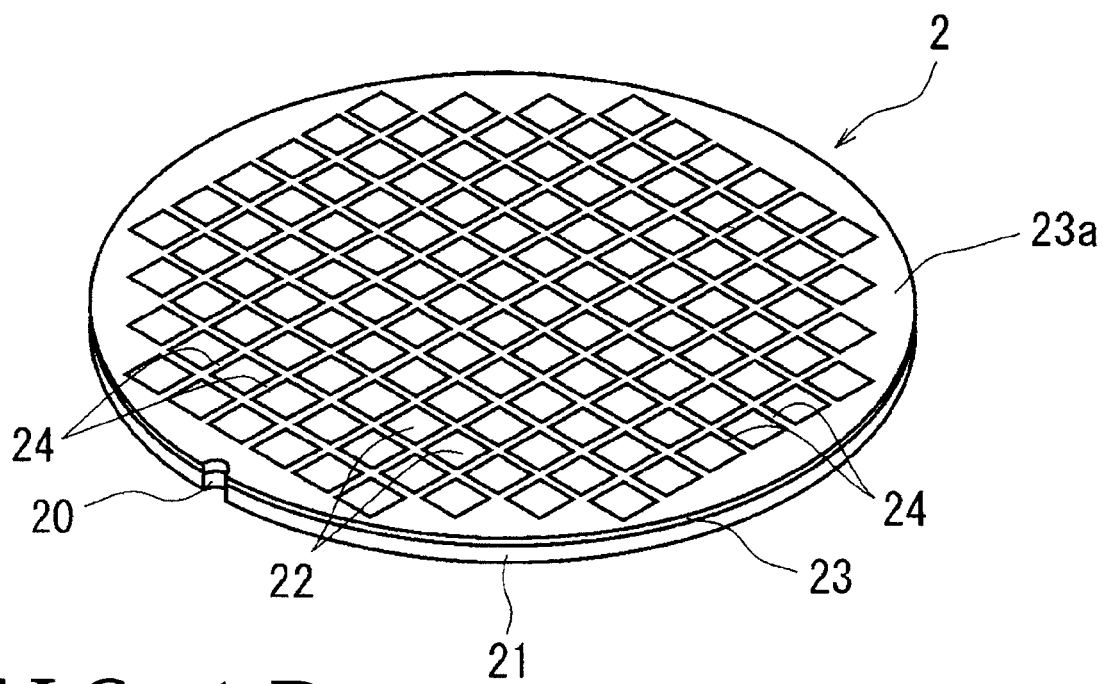
FIG. 1A is a perspective view of an optical device wafer.
Figure 1B:
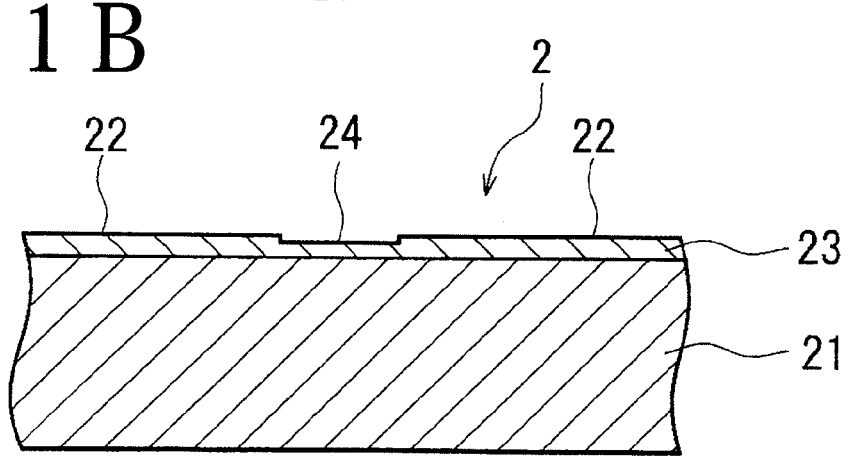
FIG. 1B is an enlarged cross-sectional view of an essential portion of the optical device wafer.

Preferred embodiments of an optical device manufacturing method according to the present invention will hereinafter be described in detail with reference to the accompanying drawings. An optical device wafer 2 illustrated in FIGS. 1A and 1B is such that an optical device layer 23 forming a plurality of optical devices 22 made of gallium nitride (GaN) or the like is formed on the front surface of a substrate 21 made of sapphire. Lattice-like streets 24 are formed on the front surface 23a of the optical device layer 23 so as to section the optical devices 22. The optical device wafer 2 is formed at an outer circumferential portion with a notch 20 indicating the crystal orientation of the sapphire substrate 21.

Figure 2:
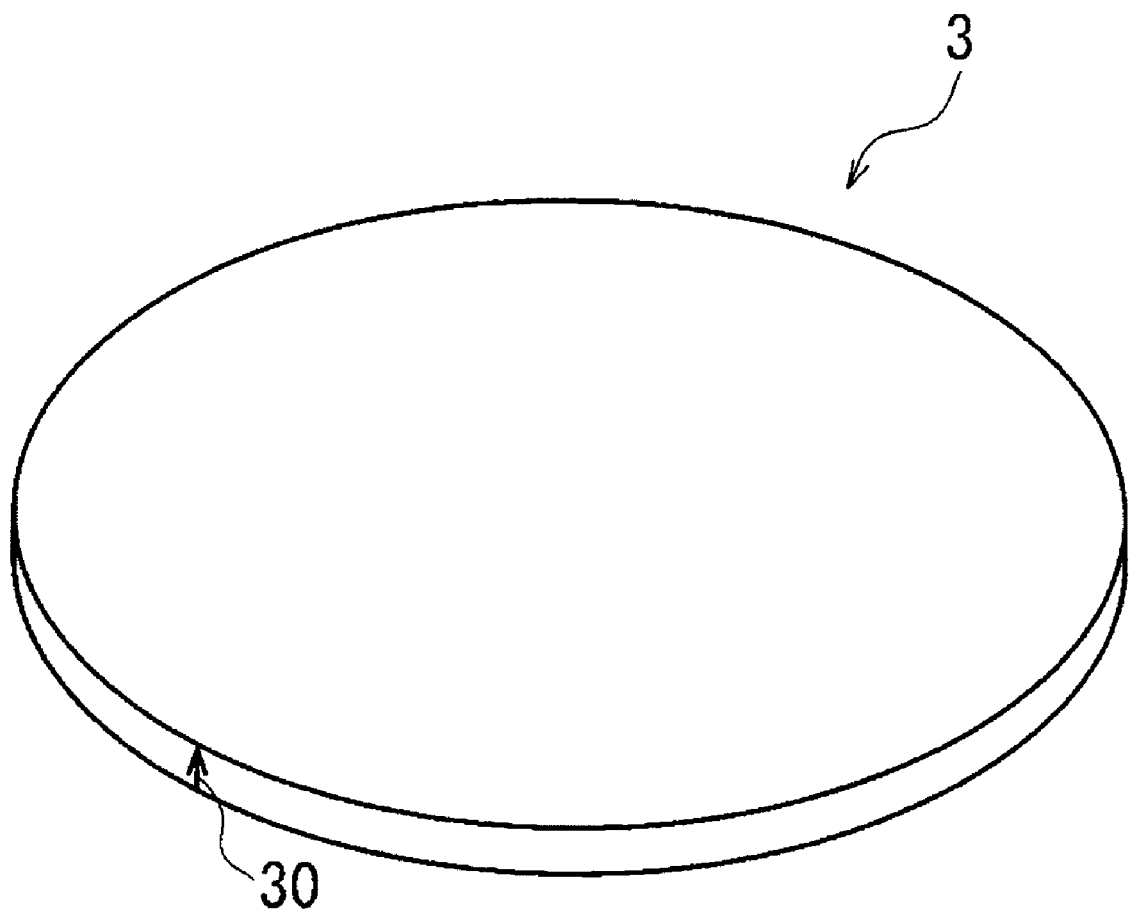
FIG. 2 is a perspective view of a heat sink material used in an optical device manufacturing method of the present invention.

A description is below given of a first embodiment of the optical device manufacturing method in which the optical device wafer 2 is divided into the plurality of optical devices 22 sectioned along the streets 24 and a heat sink is joined to each of the optical devices 22. As illustrated in FIG. 2, a heat sink material 3 is first prepared that has a size corresponding to that of the optical device wafer 2 and a thickness of e.g. 600 μm. This heat sink material 3 is made of a metal material such as copper having high thermal conductivity in the illustrated embodiment. In addition, the heat sink material 3 is formed on an outer circumferential surface with an aligning mark 30 corresponding to the notch 20 formed on the outer circumferential portion of the optical device wafer 2.

A heat sink material groove forming step of a first embodiment is next performed in which grooves are formed in the front surface of the heat sink material 3 at respective positions corresponding to the associated streets 24 so as to each have a depth corresponding to the finish thickness of the heat sink. This heat sink material groove forming step is performed using a cutting device 4 shown in FIG. 3A. The cutting device 4 includes a chuck table 41 adapted to hold a workpiece; cutting means 42 provided with a cutting blade 421; and imaging means 43. The imaging means 43 includes infrared ray illuminating means for irradiating a workpiece with an infrared ray, an optical system for capturing the infrared ray emitted from the infrared ray illuminating means, and an image pickup device (an infrared CCD (charge-coupled device)) for outputting an electric signal corresponding to the infrared ray captured by the optical system, as well as a usual imaging device (CCD) for picking up an image by use of visible light. In addition, the imaging means 43 routes a picked-up image signal to control means not shown. The cutting device 4 includes cutting-transfer means for moving the chuck table 41 in a cutting-transfer direction indicated with arrow X; indexing-transfer means for moving the cutting means 42 in the indexing-transfer direction, indicated with arrow Y, perpendicular to the cutting-transfer direction X; and incision-transfer means for moving the cutting means 42 in an incision-transfer direction indicated with arrow Z. These means are controlled by control means not shown. This control means includes a memory storing therein the coordinate values of the streets 24 formed on the optical device wafer 2.

Figure 3A:
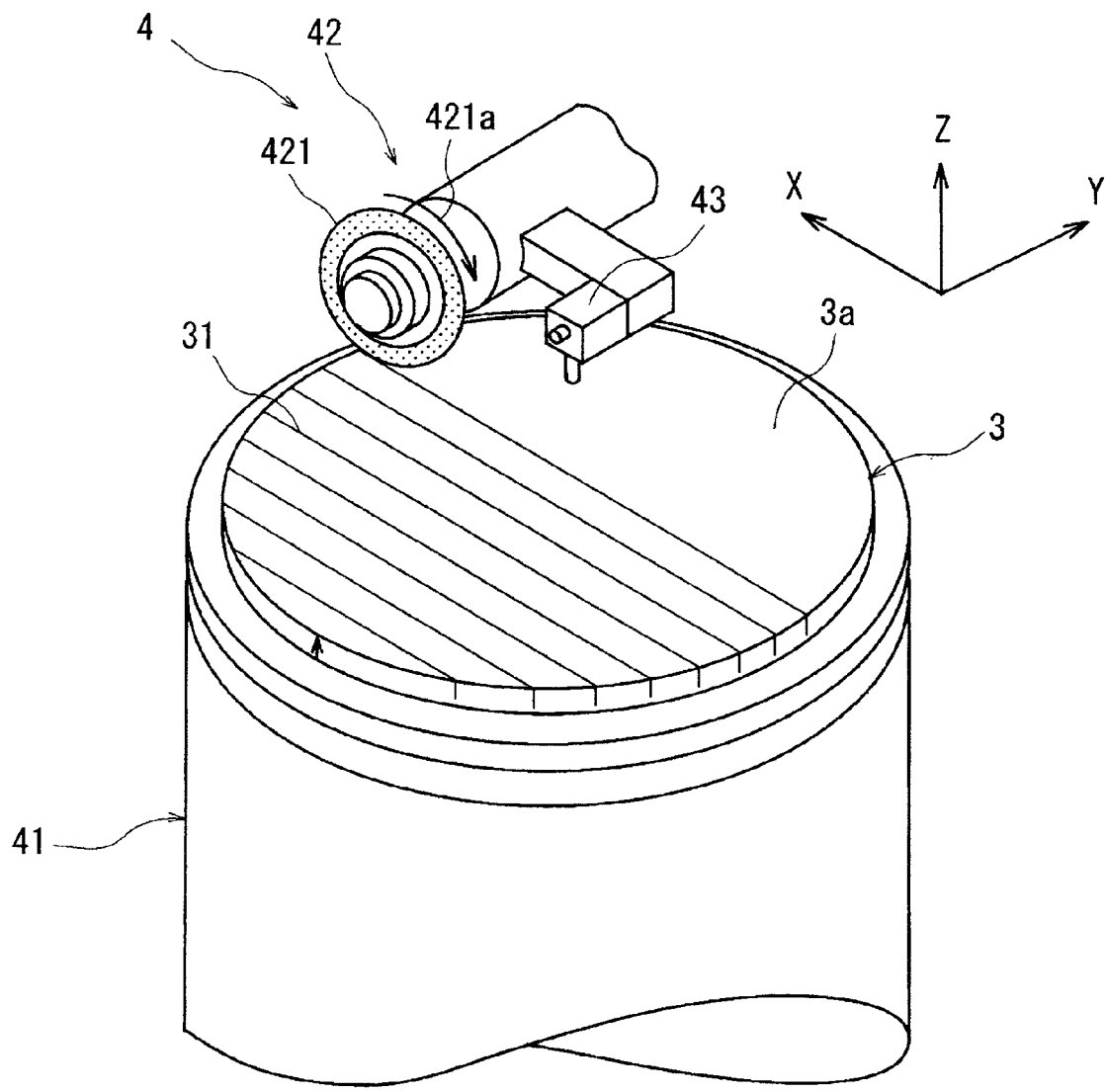
FIGS. 3A and 3B are a perspective view and a partial cross-sectional view, respectively, for assistance in explaining a heat sink material forming step in a first embodiment of the optical device manufacturing method of the present invention.

To perform the heat sink material groove forming step using the cutting device 4 shown in FIG. 3A, the heat sink material 3 is placed on the chuck table 41 with the front surface 3a thereof facing upward. The heat sink material 3 is held on the chuck table 41 by operating sucking means not shown. In this way, the heat sink material 3 sucked and held on the chuck table 41 is kept at a predetermined coordinate position.

After the heat sink material 3 has been held on the chuck table 41 as described above, the chuck table 41 holding the heat sink material 3 is moved to a cutting start position of a cut area. While being rotated in a direction indicated with arrow 421a, the cutting blade 421 is moved downward, that is, in the incision-transfer direction indicated with arrow Z in FIG. 3A. Thus, the incision-transfer is performed by a predetermined amount. The cutting blade 421 is made by hardening e.g. diamond abrasive grains suitable to cut cupper, with a resin bond. The incision-transfer position is such that the outer circumferential edge of the cutting blade 421 is set to a position (e.g. 200-500 μm) deep from the front surface 3a of the heat sink material 3 and corresponding to the finish thickness of the heat sink.

Figure 3B:
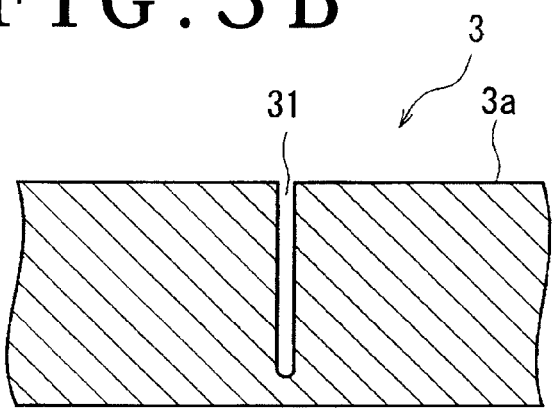

After the incision-transfer of the cutting blade 421 has been performed, while the cutting blade 421 is being rotated, the chuck table 41 is cutting-transferred in the direction indicated with arrow X in FIG. 3A. In this way, the heat sink material 3 is formed with the cut groove 31 with the depth (e.g. 200-500 μm) corresponding to the finish thickness of the heat sink as shown in FIG. 3B (the heat sink material groove forming step). The heat sink material groove forming step is performed at positions corresponding to all the streets 24 formed on the optical device wafer 2, the positions being stored in the memory of the control means. Incidentally, in the heat sink material groove forming step, the cutting device 4 is used to form the cut grooves 31 on the heat sink material 3 with the depth corresponding to the finish thickness of the heat sink by way of example. However, a laser processing machine may be used to form laser processed-grooves on the heat sink material 3.

Figure 4A:
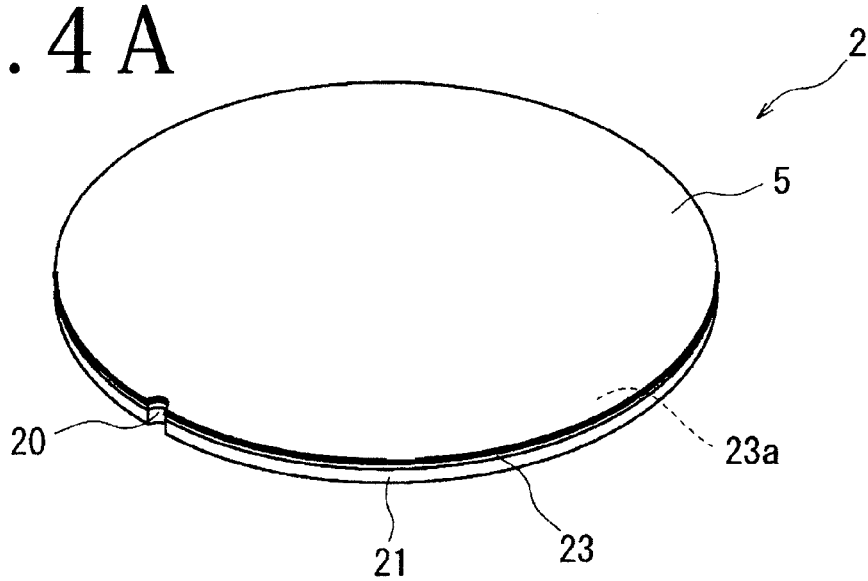
FIGS. 4A and 4B are perspective views for assistance in explaining a heat sink material joining step in the first embodiment of the optical device manufacturing method of the present invention.
Figure 4B:
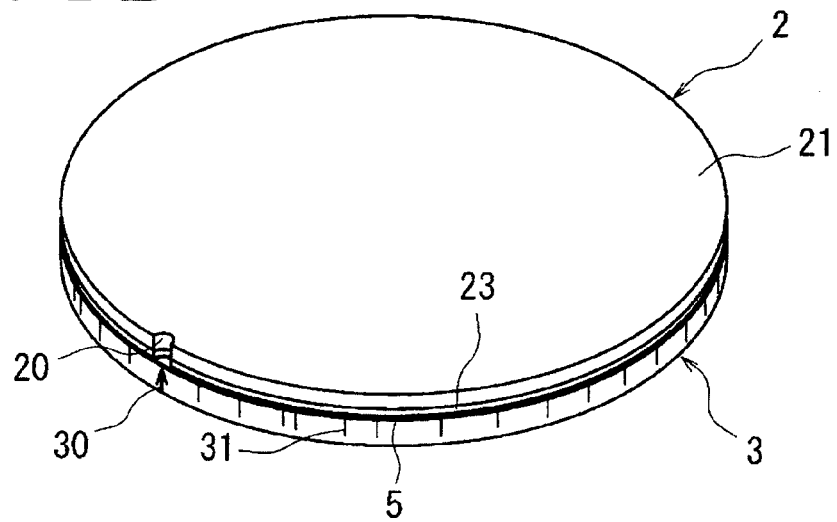

A heat sink material joining step is next performed in which the front surface 23a of the optical device layer 23 of the optical device wafer 2 is joined to the front surface 3a of the heat sink material 3 via joint metal layers with the streets 24 oppositely faced to the cut grooves 31. In this heat sink material joining step, joint metal such as gold is deposited on the front surface 23a of the optical device layer 23 of the optical device wafer 2 to form a joint metal layer 5 and on the front surface 3a of the heat sink material 3 to form a joint metal layer 5, as shown in FIG. 4A. As illustrated in FIG. 4B, the joint metal layer 5 formed on the front surface 23a of the optical device layer 23 of the optical device wafer 2 is oppositely pressure bonded to the joint metal layer 5 formed on the front surface 3a of the heat sink material 3. This allows the joint metal layer 5 formed on the front surface 23a of the optical device layer 23 of the optical device wafer 2 to be joined to the joint metal layer 5 formed on the front surface 3a of the heat sink material 3. In this case, the notch 20 formed in the optical device wafer 2 is aligned with the aligning mark 30 formed on the heat sink material 3 so that the streets formed on the optical device layer 23 of the optical device wafer 2 can each be oppositely faced to a corresponding one the cut grooves 31 formed on the front surface 3a of the heat sink material 3.

Figure 5A:
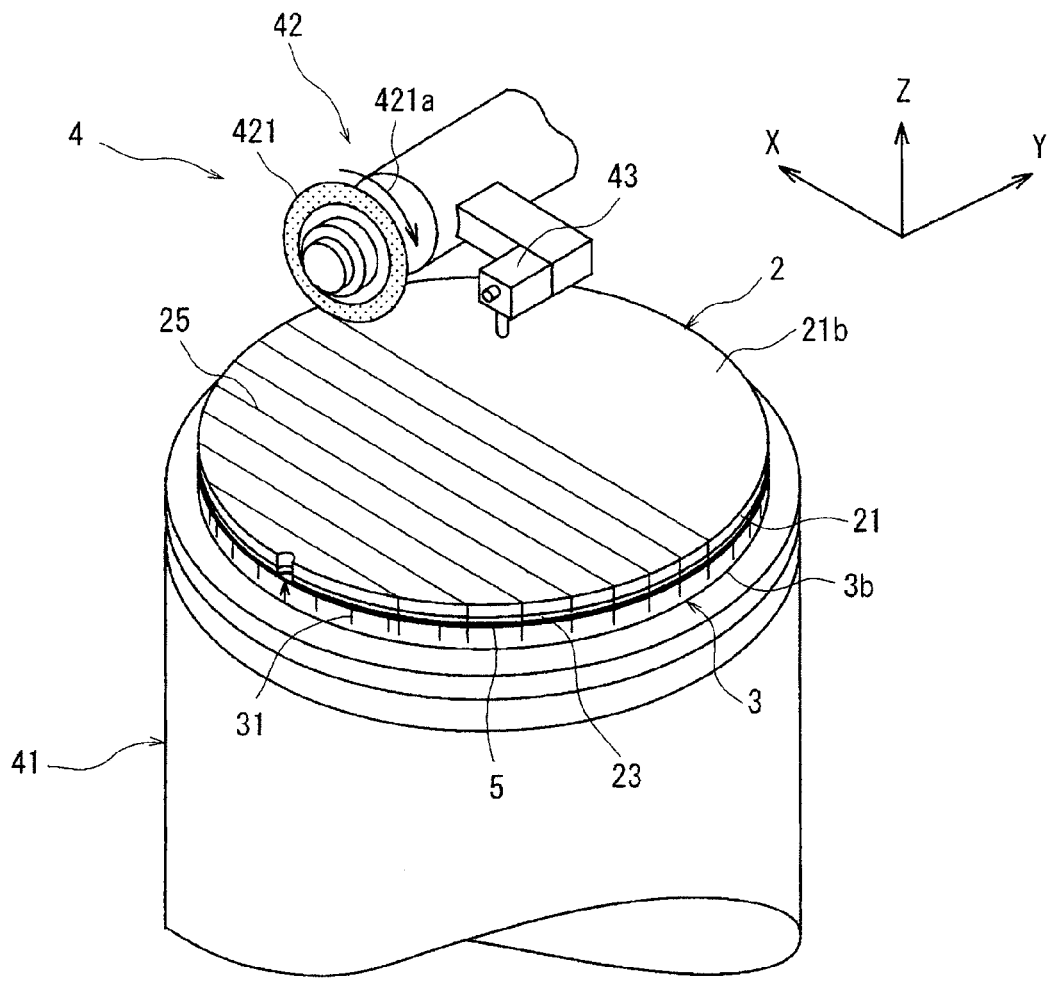
FIGS. 5A and 5B are a perspective view and a partial cross-sectional view, respectively, for assistance in explaining an optical device wafer dividing step in the first embodiment of the optical device manufacturing method of the present invention.

After the heat sink material joining step has been performed as described above, an optical device wafer dividing step is performed in which the optical device wafer 2 having the optical device 23 to which the heat sink material 3 is joined is cut and divided along the streets 24 into the individual optical devices 22. The optical device wafer dividing step can be performed using the cutting device 4 shown in FIG. 3A. More specifically, the rear surface 3b of the heat sink material 3 joined to the optical device wafer 2 is placed on the chuck table 41 as shown in FIG. 5A. By operating the sucking means, the heat sink material 3 joined to the optical device wafer 2 is held on the chuck table 41. The optical device wafer 2 to which the heat sink material 3 is joined is such that the rear surface 21b of the substrate 21 faces the upside. In this way, the chuck table 41 sucking and holding the heat sink material 3 to which the optical device wafer 2 is joined is located at a position immediately below the imaging means 43 by a cutting-transfer mechanism not shown.

After the chuck table 41 has been located at a position immediately below the imaging means 43, alignment work is performed in which the imaging means 4 and the control means not illustrated detect a cut area to be cut in the optical device wafer 2. More specifically, the imaging means 43 and the control means not illustrated perform image processing such as pattern matching for positioning between the cutting blade 421 and the street 24 formed in the predetermined direction of the optical device wafer 2 to execute the alignment of the cut area (the alignment step). Similarly, the alignment of the cut area is executed on the street 24 formed on the optical device wafer 2 to extend perpendicularly to the predetermined direction. In this case, the front surface of the optical device wafer 2 formed with the plurality of streets 24 of the optical device layer 23 forming the wafer lies on the downside. However, the imaging means 43 includes the infrared illuminating means, the optical system for capturing infrared rays, and the imaging element (the infrared CCD) for outputting an electric signal corresponding to the infrared ray. Thus, the streets 24 can be imaged by being seen through the optical device layer 23 from the side of the substrate 21.

Figure 5B:
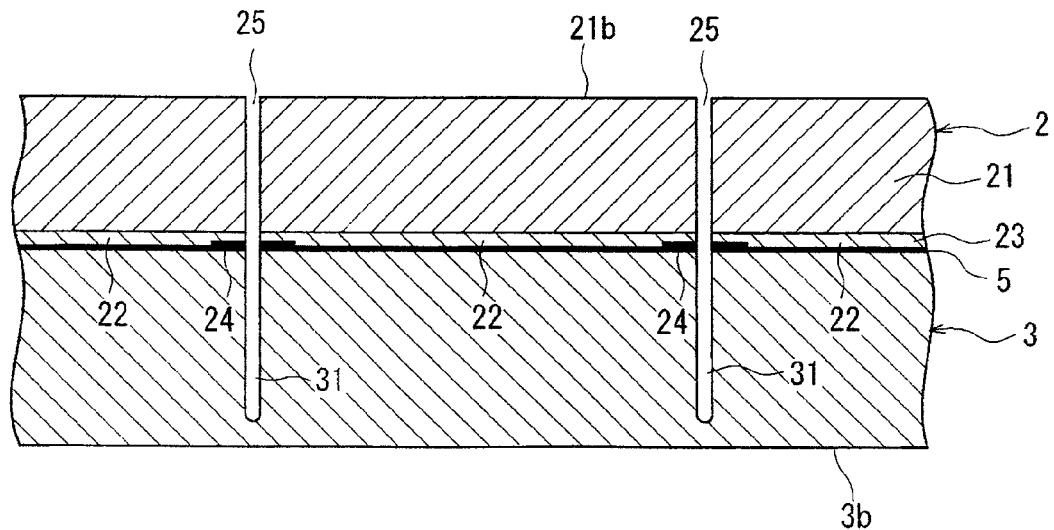

After the alignment of the cut area of the optical device wafer 2 to which the heat sink material 3 held on the chuck table 41 is joined has been performed as described above, the chuck table 41 holding the optical device wafer 2 to which the heat sink material 3 is joined is moved to the cutting start position of the cut area. While being rotated in the direction indicated with arrow 421a, the cutting blade 421 is moved downward, that is, in the incision-transfer direction indicated with arrow Z, thus performing incision-transfer by a predetermined amount, as shown in FIG. 5A. This cutting blade 421 is made by hardening, by nickel plating, e.g. diamond abrasive grains suitable to cut a brittle material. In addition, this incision-transfer position is set at such a depth-position that the outer circumferential edge of the cutting blade 421 reaches the front surface (the plane to which the front surface of the optical device layer 23 of the optical device wafer 2 is joined) of the heat sink material 3. After the incision-transfer of the cutting blade 421 has been performed in this way, while the cutting blade 421 is being rotated, the chuck table 41 is cutting-transferred in the direction indicated with arrow X in FIG. 5A. Thus, as shown in FIG. 5B, the optical device wafer 2 to which the heat sink material 3 is joined is cut through the cut grooves 25 cut along the respective associated streets 24 into the individual optical devices 22 (the cutting step). In this case, since the cut groove 31 formed in the front surface of the heat sink material 3 is oppositely positioned immediately below the corresponding street 24, the optical device wafer 2 can effectively be divided. This optical device dividing step is performed along all the streets 24 formed on the optical device wafer 2.

Figure 6A:
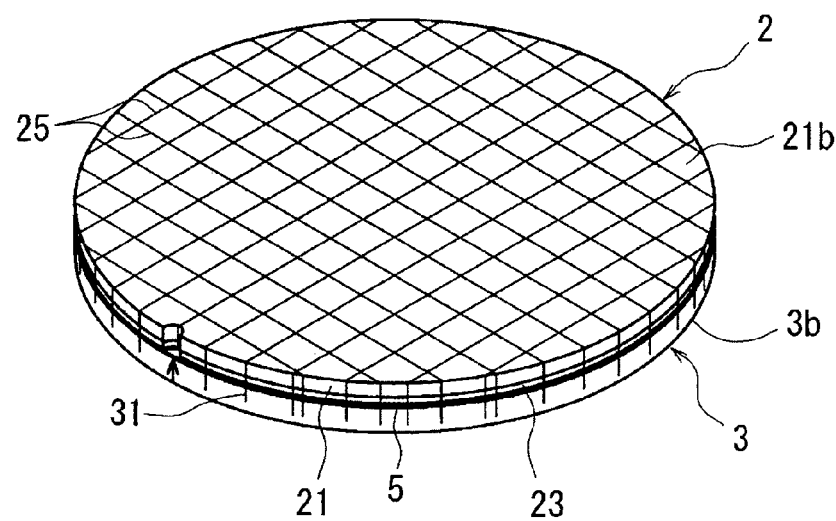
FIGS. 6A and 6B are perspective views for assistance in explaining a protection member sticking step in the first embodiment of the optical device manufacturing method of the present invention.
Figure 6B:
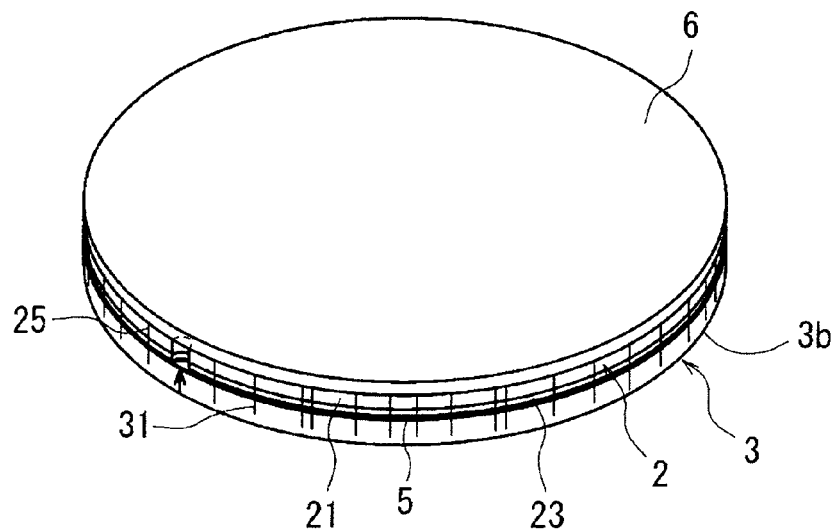

Incidentally, the optical device wafer dividing step may be performed such that the optical device wafer 2 is cut and divided along the streets 24 into the individual devices 22 by directing a laser beam along each of the streets 24 formed on the optical device wafer 2. After the optical device wafer dividing step described above has been performed, a protection member sticking step is performed in which a protection member 6 for grinding is stuck to the rear surface 21b of the substrate 21 of the optical device wafer 2 as shown in FIGS. 6A and 6B. Incidentally, the protection member 6 uses a polyolefin sheet with a thickness of 150 μm in the illustrated embodiment.

Figure 7A:
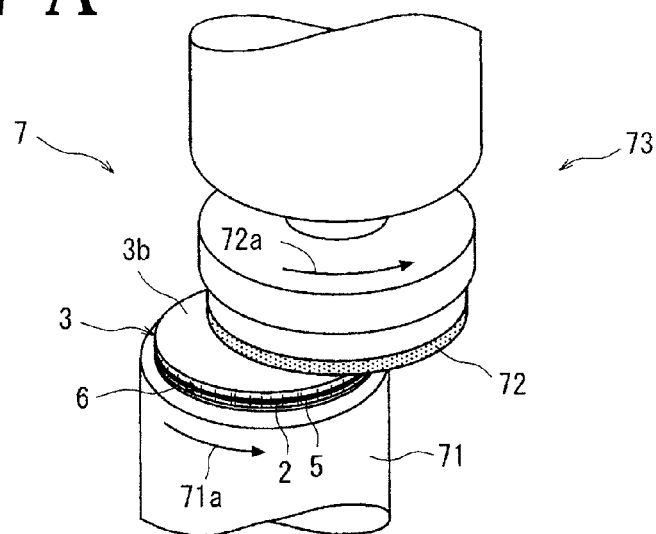
FIGS. 7A, 7B and 7C are a perspective view, a partial cross-sectional view, and a perspective view, respectively, for assistance in explaining a heat sink material dividing step in the first embodiment of the optical device manufacturing method of the present invention.
Figure 7B:
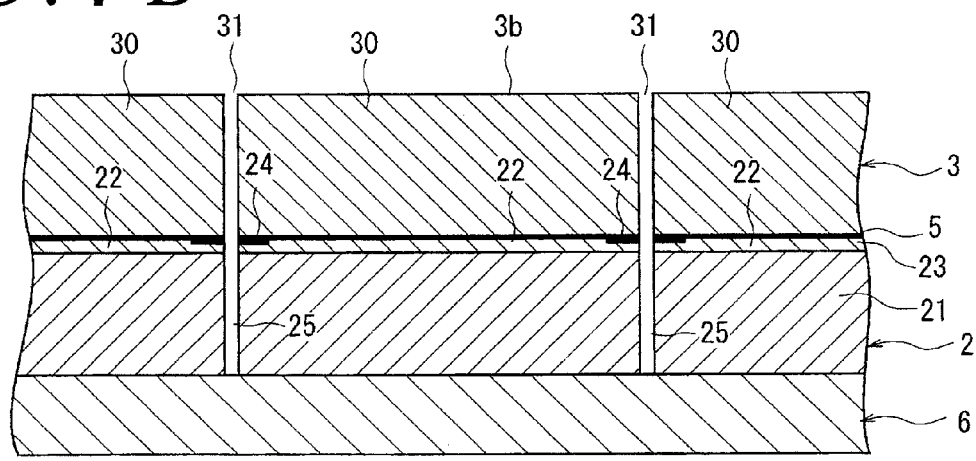
Figure 7C:
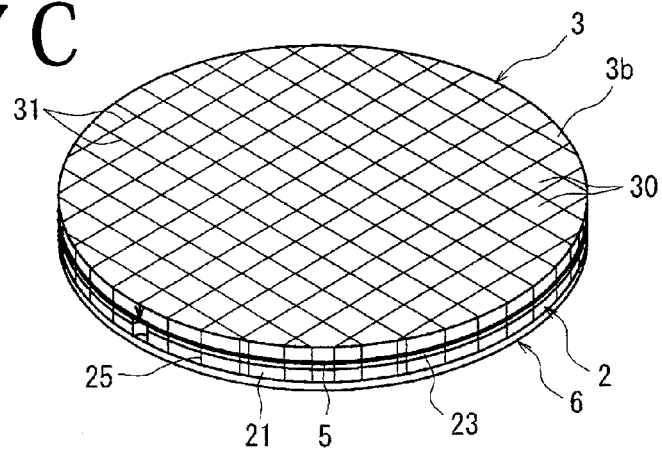

Next, a heat sink material dividing step is performed in which the rear surface 3b of the heat sink material 3 joined to the optical device layer 23 of the optical device wafer 2 to which the protection member 6 is stuck is ground to expose the cut grooves 31 to the rear surface to divide the heat sink material 3 into heat sinks corresponding to the associated individual optical devices 22. This heat sink material dividing step is performed using a grinding device 7 illustrated in FIG. 7A. The grinding device 7 includes a chuck table 71 adapted to hold a workpiece and grinding means 73 provided with a grinding stone 72. To perform the heat sink material dividing step by use of the grinding device 7, the protection member 6 stuck to the rear surface 21b of the substrate 21 of the optical device wafer 2 is placed on the chuck table 71. By operating suction means not illustrated, the optical device wafer 2 and the heat sink material 3 are sucked and held on the chuck table 71 via the protection member 6. Thus, the rear surface 3b of the heat sink material 3 faces the upside. Next, while the chuck table 71 is being rotated in the direction indicated with arrow 71a at e.g. 300 rpm, the grinding stone 72 of the grinding means 73 is rotated in the direction indicated with arrow 72a at 6000 rpm and brought into contact with the rear surface 3b of the heat sink material 3 for grinding. This grinding is continued until the cut groove 31 is exposed to the rear surface 3b as shown in FIG. 7B. By performing the grinding until the cut groove 31 is exposed to the rear surface 3b, the heat sink material 3 joined to the individually divided devices 22 as shown in FIGS. 7B and 7C is divided into the heat sinks 30 corresponding to the associated individual devices 22.

Figure 8:
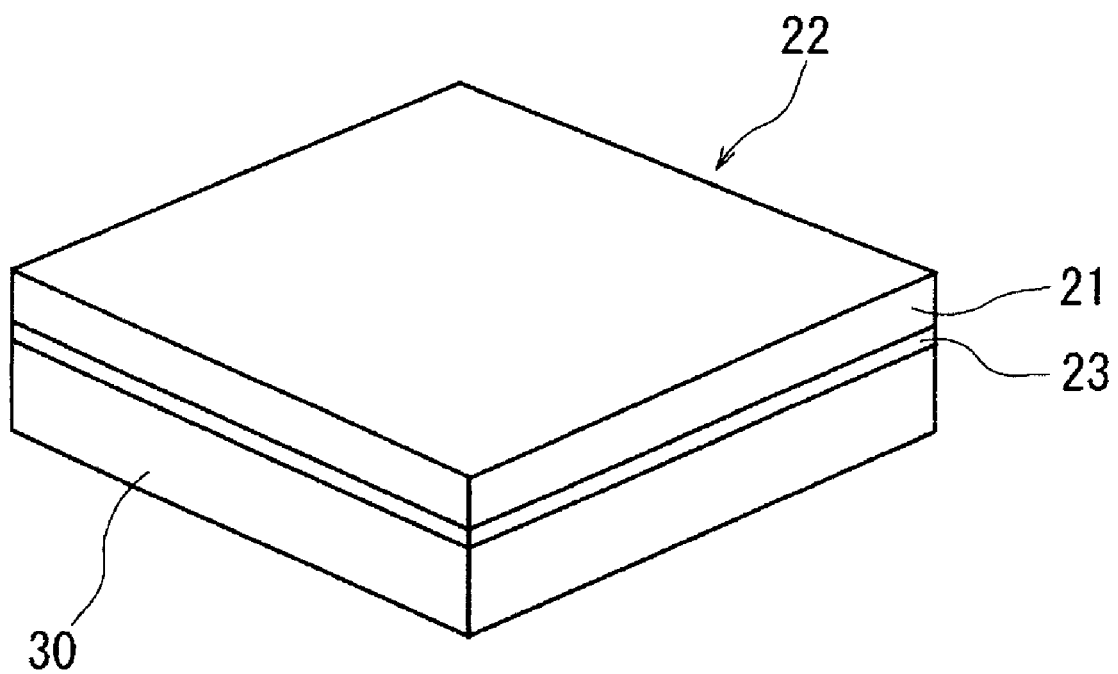
FIG. 8 is a perspective view of an optical device manufactured by the first embodiment of the optical device manufacturing method of the present invention.

After the heat sink material dividing step has been performed as described, the individual devices 22 to which the individually divided heat sinks 30 are joined and which are stuck to the protection member 6 are peeled off and picked up from the protection member 6 in a pick-up step. Thus, the individual devices 22 to which the associated heat sinks 30 are joined can be obtained as illustrated in FIG. 8.

In the first embodiment of the present invention as described above, the cut grooves 31 each having the depth corresponding to the finish thickness of the heat sink material are formed on the front surface 3a of the heat sink material 3 having the size corresponding to that of the optical device wafer 2, at the respective positions corresponding to the associated streets 24 (the heat sink material groove forming step). The heat sink joining step is performed in which the front surface 23a of the optical device layer 23 of the optical device wafer 2 is joined to the front surface 3a of the heat sink material 3 via the joint metal layers with each of the streets 24 oppositely faced to a corresponding one of the cut grooves 31. Thereafter, the optical device wafer 2 is cut and divided along the streets 22 into the individual optical devices (the optical device wafer division step). Next, the rear surface 3b of the heat sink material 3 is ground to expose the cut grooves 31 to the rear surface 3b, so that the heat sink material 3 is divided into the heat sinks 30 each corresponding to a corresponding one of the individual optical devices 22 (the heat sink material dividing step). Thus, the optical device 30 to which the heat sinks 30 is joined can efficiently be manufactured.

Figure 9A:
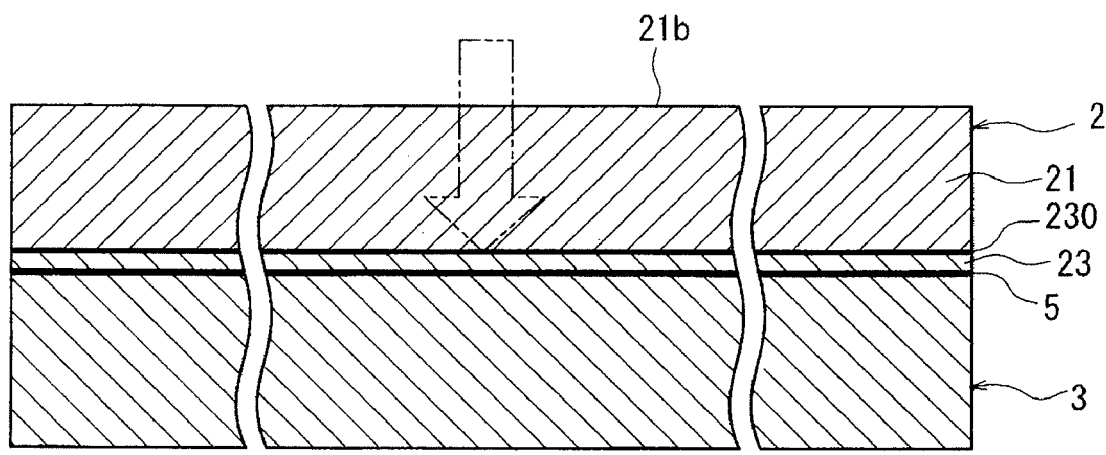
FIGS. 9A and 9B are a partial cross-sectional view and a perspective view, respectively, for assistance in explaining a second embodiment of the optical device manufacturing method of the present invention.
Figure 9B:
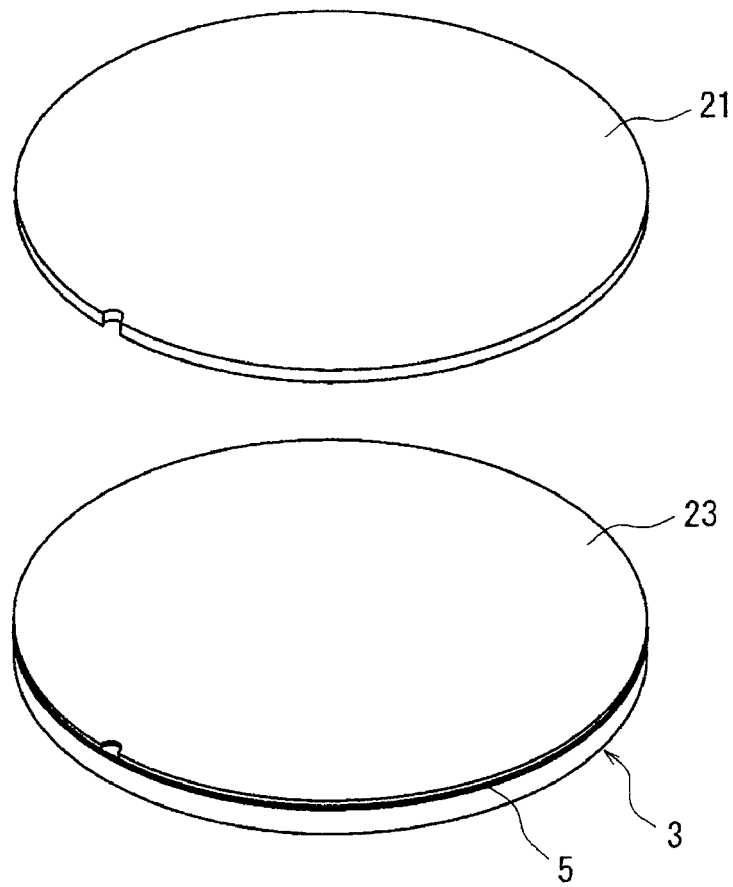

A description will next be given of a second embodiment of the present invention. The second embodiment is a method in which a substrate 21 and an optical device layer 23 constituting an optical device wafer 2 are peeled off from each other to remove the substrate 21 and a heat sink is joined to an optical device composed of only the optical device layer 23. Also in the second embodiment, the heat sink material groove forming step and heat sink material joining step in the first embodiment are performed. After the heat sink material groove forming step and heat sink material joining step have been performed as described above, a substrate peeling-off step is performed in which the substrate 21 of the optical device wafer 2 having the optical device layer 23 to which a heat sink material 3 is joined is peeled off from the optical device layer 23. In the substrate peeling-off step, during the manufacture of the optical device wafer 2 as illustrated in FIGS. 9A and 9B for example, a lift-off layer 230 composed of an AlGaN layer is preliminarily formed between the substrate 21 and the optical device layer 23. Application of stress to the lift-off layer 230 separates the substrate 21 from the optical device layer 23. The substrate peeling-off step of separating the substrate from the optical device layer as described above can be performed by the method disclosed in e.g. Japanese Patent Laid-open No. 2000-101139.

Figure 10:
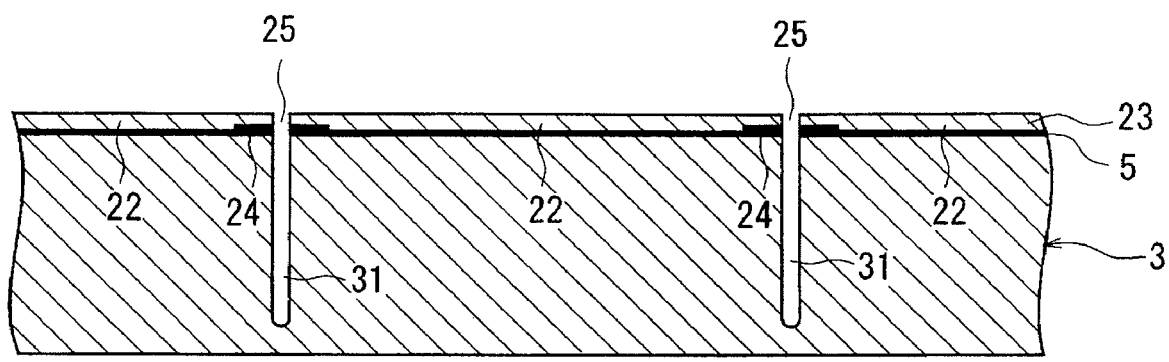
FIG. 10 is an enlarged cross-sectional view of an essential view of an optical device wafer subjected to an optical device layer dividing step in the second embodiment of the optical device manufacturing method of the present invention.

After the substrate peeling-off step has been performed, an optical device layer dividing step is performed in which the optical device layer 23 of the optical device wafer 2 from which the substrate 21 is peeled off is cut and divided along streets 24 into individual optical devices 22. The optical device layer dividing step is performed similarly to the optical device dividing step of the first embodiment by use of the cutting device 4 illustrated in FIG. 3A. Consequently, as illustrated in FIG. 10, the optical device layer 23 from which the substrate is peeled off and removed and to which the heat sink material 3 is joined is cut through cut grooves 25 cut along the associated streets 24 and divided into individual optical devices 22.

Figure 11A:
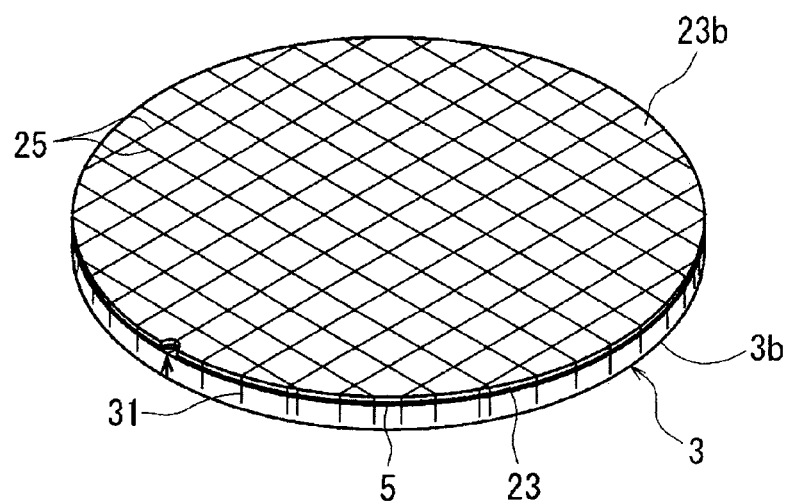
FIGS. 11A and 11B are perspective views for assistance in explaining a protection member sticking step in the second embodiment of the optical device manufacturing method of the present invention.
Figure 11B:
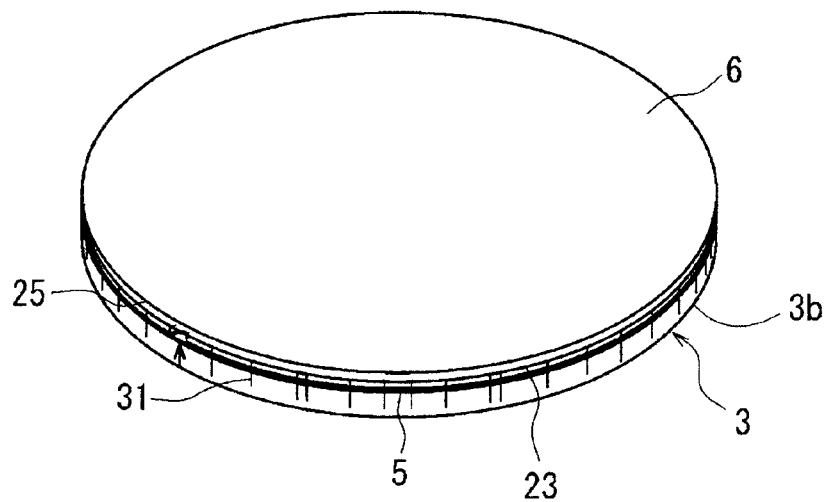
Figure 12:
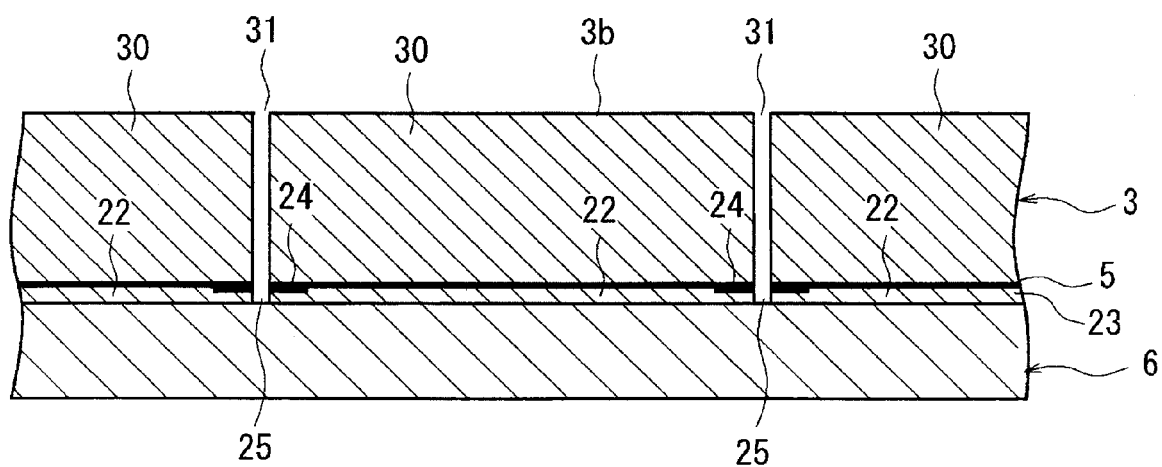
FIG. 12 is an enlarged cross-sectional view of an essential portion of an optical device wafer subjected to a heat sink material dividing step in the second embodiment of the optical device manufacturing method of the present invention.
Figure 13:
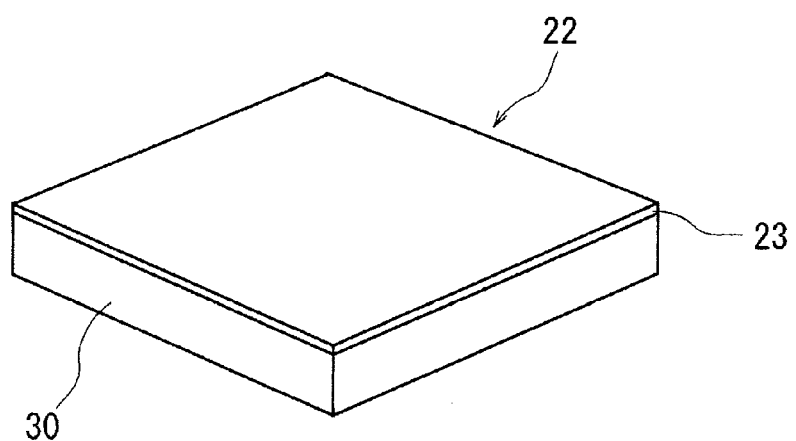
FIG. 13 is a perspective view of an optical device manufactured by the second embodiment of the optical device manufacturing method of the present invention.

A protection member sticking step is next performed in which a protection member is stuck to the rear surface 23b of the optical device layer 23 having been subjected to the optical device dividing step. In this protection member sticking step, as illustrated in FIGS. 11A and 11B, a protection member 6 for grinding is stuck to the rear surface 23b of the optical device layer 23 to which the heat sink member 3 is joined.

After the protection member sticking step has been performed, the rear surface 3b of the heat sink material 3 joined to the optical device layer 23 to which the protection member 6 is stuck is ground to expose the cut groove 31 to the rear surface, thereby dividing the heat sink member 3 into heat sinks corresponding to the associated individual optical devices 22. The heat sink material dividing step is performed similarly to the heat sink material dividing step of the first embodiment by use of the grinding device 6 illustrated in FIG. 7A. Consequently, the heat sink material 3 from which the substrate is peeled off and removed and which is joined to the optical device 22 is divided into heat sinks 30 corresponding to associated individual devices 22.

After the heat sink material dividing step has been performed as described above, the individual optical devices 22 to which the individually divided heat sinks 30 are joined and to which the protection member 6 is stuck are peeled off and picked up from the protection member 6 in the picking-up step. Thus, the individual device 22 to which the heat sink 30 is joined and from which the substrate is peeled off and removed can be obtained. As described above, in the optical device wafer 2, the substrate 21 which functionally becomes unnecessary after the optical device layer 23 has been formed on the front surface of the substrate 21 made of sapphire or silicon carbide is peeled off and removed; therefore, the individual devices 22 to which the heat sinks are joined can each be made compact and functional by itself.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An optical device manufacturing method of dividing an optical device wafer into a plurality of optical devices sectioned along streets, the optical device wafer being formed with the optical devices in an optical device layer laminated on a front surface of a substrate, the method comprising:

a heat sink material groove forming step of forming a groove with a depth corresponding to a finish thickness of the heat sink in a front surface of a heat sink material having a size corresponding to that of the optical device wafer at a position corresponding to an associated one of the streets sectioning the plurality of optical devices;

a heat sink material joining step of joining the front surface of the optical device layer of the optical device wafer to the front surface of the heat sink material via a joining metal layer with the street oppositely faced to the groove;

an optical device wafer dividing step of cutting and dividing the optical device wafer along the streets into individual optical devices, the optical device wafer having the optical device layer to which the heat sink material is joined;

a protection member sticking step of sticking a protection member to a rear surface of the substrate of the optical device wafer having been subjected to the optical device wafer dividing step; and a heat sink material dividing step of grinding the rear surface of the heat sink material joined to the optical device layer of the optical device wafer to which the protection member is stuck to expose the grooves to the rear surface to thereby divide the heat sink material into heat sinks corresponding to associated individual optical devices.

2. An optical device manufacturing method of dividing an optical device wafer into a plurality of optical devices sectioned along streets, the optical device wafer being formed with the optical devices in an optical device layer laminated on a front surface of a substrate, the method comprising:

a heat sink material groove forming step of forming a groove with a depth corresponding to a finish thickness of the heat sink in a front surface of a heat sink material having a size corresponding to that of the optical device wafer at a position corresponding to an associated one of the streets sectioning the plurality of optical devices;

a heat sink material joining step of joining the front surface of the optical device layer of the optical device wafer to the front surface of the heat sink material via a joining metal layer with the street oppositely faced to the groove;

a substrate peeling-off step of peeling off from the optical device layer the substrate of the optical device wafer having the optical device layer to which the heat sink material is joined;

an optical device layer dividing step of cutting and dividing the optical device layer from which the substrate of the optical device wafer has been peeled off, along the streets into individual optical devices;

a protection member sticking step of sticking a protection member to a rear surface of the optical device layer having been subjected to the optical device layer dividing step; and a heat sink material dividing step of grinding a rear surface of the heat sink material joined to the optical device layer to which the protection member is stuck to expose the grooves to the rear surface to divide the heat sink material into heat sinks corresponding to the associated individual optical devices.

* * * * *